(12) United States Patent
Ishikawa et al.

(10) Patent No.: US 6,423,974 B1
(45) Date of Patent: Jul. 23, 2002

(54) X-RAY IMAGING APPARATUS USING SPHERICAL SEMICONDUCTOR DETECTORS

(75) Inventors: Akira Ishikawa, Royce City; Nabuo Takeda, Richardson; Suzanne I. Ahn; Steven R. Hays, both of Dallas; Alex Freeman, Plano, all of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/321,862

(22) Filed: May 28, 1999

(51) Int. Cl.$^7$ ................................. H05G 1/64
(52) U.S. Cl. .............................. 250/370.14; 250/370.01
(58) Field of Search ........................ 250/370.14, 370.01, 250/370.07, 332, 338.1, 349, 366, 367

(56) References Cited

U.S. PATENT DOCUMENTS

| | | | |
|---|---|---|---|
| 4,755,681 A | 7/1988 | Oka et al. | 250/370.01 |
| 4,785,186 A | 11/1988 | Street et al. | 250/370.14 |
| 4,905,265 A | 2/1990 | Cox et al. | 378/99 |
| 5,081,664 A | 1/1992 | Lie et al. | 378/207 |
| 5,818,898 A | 10/1998 | Tsukamoto et al. | 378/98.8 |
| 5,877,943 A | 3/1999 | Ramamurthi | 361/783 |
| 6,052,517 A * | 4/2000 | Matsunaga et al. | 395/500.09 |

OTHER PUBLICATIONS

A large area solid–state detector for radiology using amorphous selenium, Zhao, W. and Rowlands, J.; Medical Imaging VI: Instrumentation (1992), SPIE vol. 1651, pp. 134–143.

An Improved Page–size 127 um Pixel Amorphous Silicon Image Sensor for X–Ray Diagnostic Medical Imaging Applications, Weisfeld, R., Street, R., Apte, R., Moore, A; dpiX AXerox Company, Palo Alto, CA; Xerox Palo Alto Research Center, Palo Alto, CA; SPIE vol. 3032, pp. 14–21.

A Novel Detection Scheme for Large Area Imaging of Low Energy X–Rays Using Amorphous Silicon Technology, Transducers '97, 1997 International Conference on Solid–State Sensors and Actuators, Chicago, Jun. 16–19, 1997; pp. 1299–1302.

a—Si:H Schottky Diode Direct Detection Pixel for Large Area X–ray Imaging, Aflatooni, K., Nathan, A., Hornsey, R., Cunningham, I.A., Chamberlain, S.G.; Electrical and Computer Engineering, University of Waterloo, Waterloo, Ontario N2L 3G1, Canada; Robarts Research Institute, University Hospital, London, Ontario N6a 5K8, Canada; DALSA Inc., 605 McMurray Rd., Waterloo, Ontario N2V 2E9, Canada; pp. 8.4.1–8.4.4.

* cited by examiner

Primary Examiner—Constantine Hannaher
Assistant Examiner—Otilia Gabor
(74) Attorney, Agent, or Firm—Howison, Thoma & Arnott, L.L.P.

(57) ABSTRACT

A solid state X-ray detector (106) is disclosed which is comprised of a plurality of Spherical ICs (202)–(208) disposed on a substrate (210). The Spherical ICs each have a plurality of detector picture elements (pixels) (302) disposed on the surface thereof. Each of the pixels (302) is formed from a layer of hydrogenated amorphous silicon (502) with a heavy metal layer (504) of molybdenum (Mo) disposed thereon as the cathode and a metal layer (508) disposed on the lower surface thereof. The cathode is reverse biased and X-rays impinging thereon will cause a transfer of electron-holes to the lower plate, which are stored on a capacitor (608). The electrons are accumulated over a predetermined period of time and then sampled and processed for output on a display (12) in real time or for storage of a digital value in a memory (114).

16 Claims, 7 Drawing Sheets

X-RAY IMAGING APPARATUS USING SPHERICAL SEMICONDUCTOR DETECTORS

TECHNICAL FIELD OF THE INVENTION

The present invention pertains in general to X-ray detectors and, more particularly, to a flat panel solid state X-ray detector for being disposed in an array.

BACKGROUND OF THE INVENTION

The use of flat panel X-ray detectors has been known in the art as being capable of digitally x-ray imaging a human body under examination in real time. They are operable to convert incident X-rays directly into electric charges and obtain electric signals therefrom. Alternatively, there are provided indirect detectors which convert incident X-rays into light and then convert the light into electric charges, which electric charges are then converted into electric signals.

These flat panel X-ray detectors are useful in that they remove the need for film emulsions. There are two types of detectors, one which requires a relatively high voltage X-ray emission and one that requires a lower voltage X-ray emission. The higher voltage X-ray emissions are facilitated by detectors that utilize an amorphous selenium layer that is operable to collect electrons which are then stored in a capacitor. These capacitors can then be sampled in a sequential manner to extract a charge therefrom, which charge correlates to the amount of energy received from the X-rays, this being affected by the density of the material disposed between, the X-ray source and the surface of the detector. This type of detector is described in W. Zhao and J. A. Rowlands, "A Large Area Solid-State Detector for Radiology Using Amorphous Selenium," SPIE Vol. 1651, Medical Imaging VI Instrumentation (1992) TP 134–143, which is incorporated herein by reference. The lower voltage X-ray detector utilizes a layer of hydrogenated amorphous silicon (a-Si:H) with a layer of heavy metal such as molybdenum (Mo) to form a Schottky diode. This Schottky diode is reverse biased and the charge collected on the anode thereof, which charge is then gated to a charge collection amplifier.

Flat panel x-ray detectors eliminate the requirement for processing and developing photographic film. The development process requires several minutes of time. Development of portable x-rays takes place at a central developing area distant from where the x-rays are performed. The most common film used in radiology is coated on both sides to increase x-ray beam absorption. This can potentially lead to unsharpness by a process of "print-through". "Print-through" occurs when light is not absorbed by the film emulsion on one side and is transmitted through to the emulsion on the opposite side. The "print-through" image is unsharp on the film due to the increase in distance the non-absorbed light has to travel. With the current technique, the semiconductor sensor balls are offset in two to three layers trapping all light directed at the flat panel. The picture will then generate an almost instantaneous image upon a view screen. The entire imaging system currently in use is very dependent upon film processing. Steady state conditions must be maintained with regards to temperature conditions and concentration of developer and fixer. Any variance in the film development process can lead to poorer quality images and the risk of missed diagnoses.

Recently, radiologic images have been created on view screens using flat plate x-ray detectors. The clarity of the x-ray image is clinically judged by the resolution of the system. Resolution is defined as the capacity of the system to show details separated in the x-ray image if they are separated in the viewed object. The current system allows for increased sensitivity to improve resolution. Each ball sensor(s) relays evidence for energy detection to the central processing unit. The sensor on each ball encompasses only a small area and can send information signaling excitation only for that specific area.

SUMMARY OF THE INVENTION

The present invention disclosed and claimed herein comprises an X-ray detector. The X-ray detector includes a plurality of detector elements, each having a defined surface area and for detecting energy from impinging x-rays on the defined surface area to provide an output signal therefrom with a level corresponding to the energy of the impinging X-rays. A plurality of supporting substrates are provided, each for supporting at least one of the detector elements, each of the supporting substrates having a non-planar surface. A base is provided for supporting. the supporting substrates, such that the detector elements are directed in a substantially common direction. A processing system then processes the output of each of the detector elements to define a two-dimensional image.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
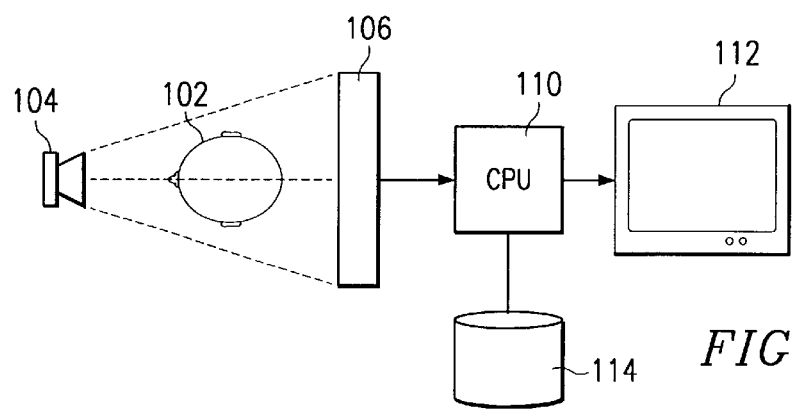
FIG. 1 illustrates a diagrammatic view of an X-ray source generator utilized in conjunction with the flat detector.

Referring now to FIG. 1, there is illustrated a conventional X-ray imaging apparatus utilizing a flat panel X-ray detector. A human body 102 under examination is irradiated with X-rays emitted from an X-ray tube 104, and X-rays transmitted through the human body 102 are directed on to a flat panel X-ray detector 106. The flat panel X-ray detector 106, as will be described hereinbelow in more detail comprises a two-dimensional array of detector elements, each of which forms a picture element (pixel). Signals are output from the detector 106 and fed to a processor 110 for assembling into an image for display on a display 112. During processing, the CPU 110 is operable to digitize the analog output of the X-ray detector 106 and store the digital information in a memory 114. As will also be described in more detail hereinbelow, the CPU 110 can modify the analog output from the detector 106, store this information in the memory 114 for later retrieval therefrom and subsequent display on the display 112, or directly display the information on the display 112 in real time. The flat panel is only one embodiment. In another embodiment, a curvilinear display could be fabricated. This would allow the object being examined to be disposed adjacent to the surface at all points. This allows the object to have any point thereon disposed only a short distance from the surface of the display. Additionally, it should be understood that the object being examined could be any type of object, a human or animal body, a plant or an inanimate object.

Figure 2:
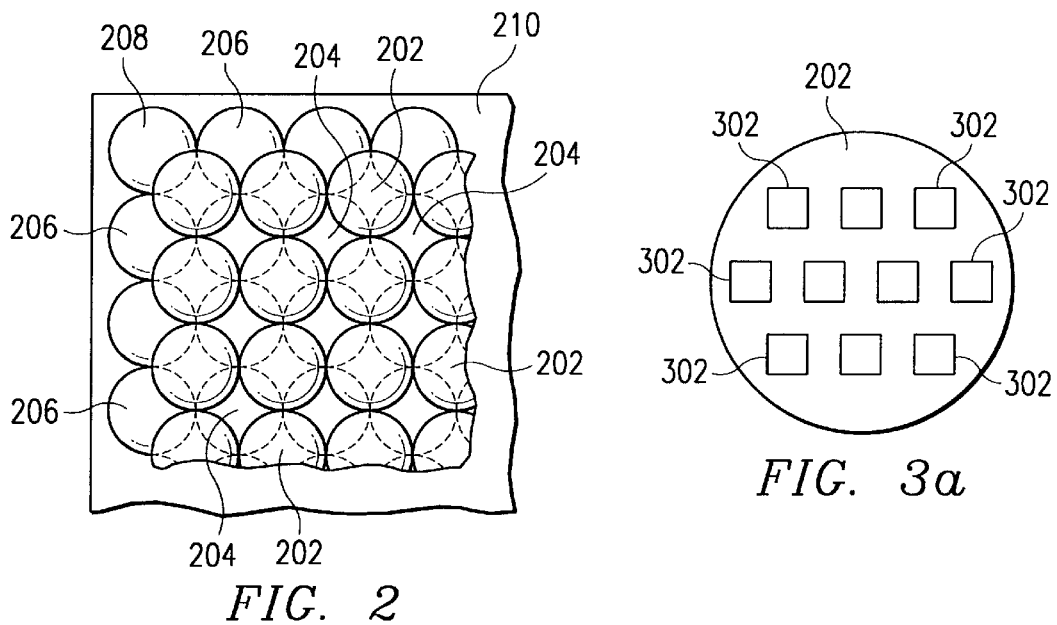
FIG. 2 illustrates a sectional view of the upper surface of the flat detector.

Referring now to FIG. 2, there is illustrated a section view of the detector array 106 illustrating a plurality of detector elements, which detector elements contain a plurality of pixels. The detector elements are all spherical elements or balls which utilize a spherical semiconductor device. A spherical semiconductor device is described in U.S. patent application Ser. No. 08\858,004, entitled *SPHERICAL SHAPED SEMICONDUCTOR INTEGRATED CIRCUIT*, filed May 16, 1997, claiming benefit of U.S. Provisional Application No. 604\032,340, filed Dec. 4, 1996, which is incorporated herein by reference. There are four types of spherical detector elements provided. These are a top Spherical IC 202, a center Spherical IC 204, an edge Spherical IC 206 and a corner Spherical IC 208. Each of the Spherical ICs has the potential of having a plurality of pixel elements disposed on the upper surface thereof. The top Spherical ICs 202 are disposed in an upper layer and the remaining Spherical ICs, the center Spherical IC 204, the edge Spherical IC 206 and the corner Spherical IC 208, are disposed in a second layer, which second layer is disposed on the surface of a substrate 210.

Figure 3A:
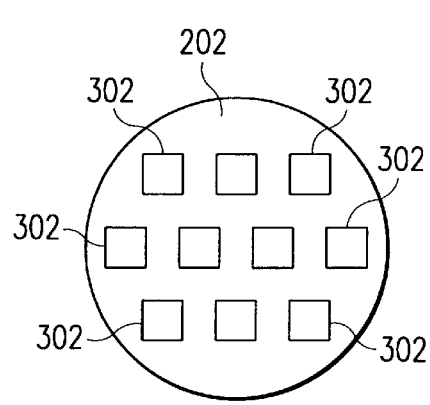
FIGS. 3a–3d illustrate the different spherical semiconductors and the detector array pixels disposed thereon.
Figures 3B, 3C, 3D:
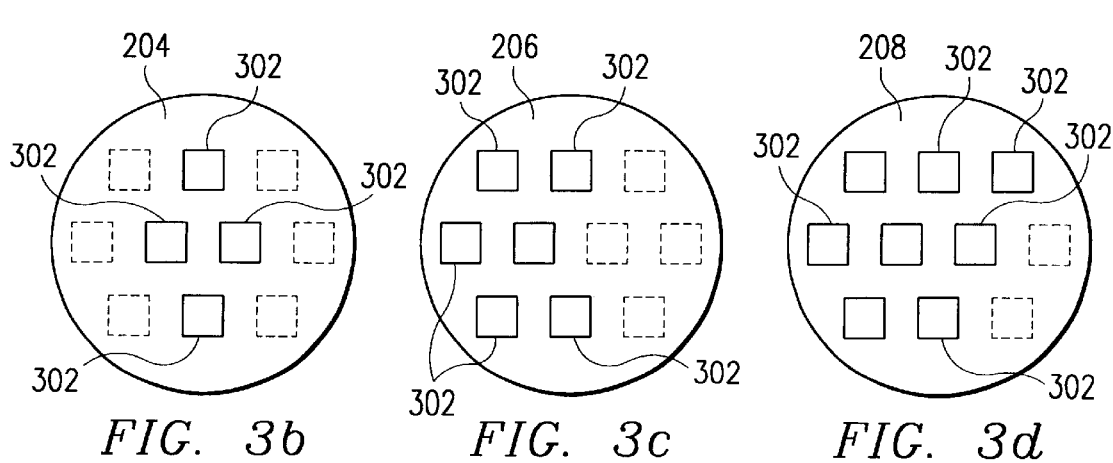

Referring now to FIGS. 3a–3b, there are illustrated top views of each of the Spherical ICs 202–208. In the Spherical IC 202, illustrated in FIG. 3a, there are illustrated ten pixels 302 on the upper surface thereof. The Spherical IC is one millimeter (mm) in diameter. The area of each of the pixels 302 is approximately 500 microns². The pixels 302 are illustrated on three rows, a center row with four pixels 302, and an upper and lower row with three pixels 302 each. However, these can be arranged in any manner desirable and do not necessarily need to be rectangular in shape. In the disclosed embodiment, all the pixels are illustrated as being somewhat along an array for fabrication purposes. In FIG. 3b, there is illustrated a top view of the center Spherical IC 204. Only two of the pixels 302 in the center row and one each in the upper and lower rows are included. In FIG. 3c, there is illustrated a top view of the edge Spherical IC 206. In this view, there are only illustrated six pixels 302, two from each of the rows on one side thereof. In the corner Spherical IC 208, there are illustrated eight of the pixels 302, three from the top row, three from the center row and two from the bottom row. Again, the arrangement of pixels can be modified, depending on how much surface area is to be exposed from the bottom layer as a result of the arrangement of the top row.

Each of the pixels 302 is sized such that the upper surface area of the Spherical IC is as completely covered as possible with the display area. This is to ensure that a large portion of the pixels 302 are disposed on the very top surface of the Spherical IC.

Figure 4:
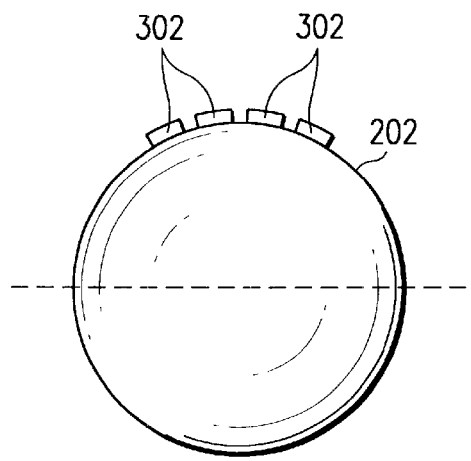
FIG. 4 illustrates a cross-sectional diagram of one of the spherical semiconductor detectors.
Figure 5:
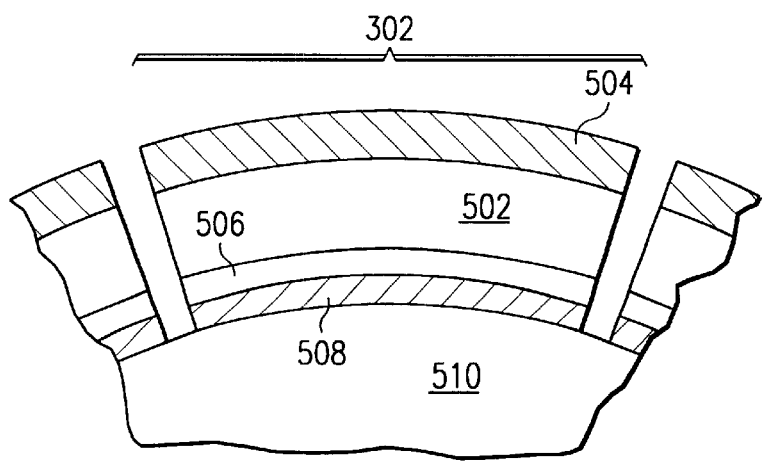
FIG. 5 illustrates a detailed cross section of one of the detector pixels.

Referring now to FIG. 4, there is illustrated a cross-sectional diagram of one of the Spherical ICs 202 illustrating one row of pixel elements 302. FIG. 5 illustrates a more detailed diagrammatic view of each of the pixel elements 302. Each of the pixel elements 302 is comprised of a layer of amorphous hydrogenated silicon (a-Si:H) 502 which is disposed under a layer of heavy metal 504, which is molybdenum (Mo) to form a Schottky diode which allows detection of low energy X-rays. The layer of Si:H 502 is disposed over a layer of N-type doped a-Si:H material 506 which is disposed over a conductive layer 508. The conductive layer 508 is disposed on a silicon substrate 510, which silicon substrate is provided by the Spherical IC. The construction of the structure will be described in more detail hereinbelow. However, the placement and separation of the various pixels 302 will be determined by the process technology which will define the minimum spacings between adjacent elements on the surface of the semiconductor substrate 510 in the form of the Spherical IC.

Figure 6:
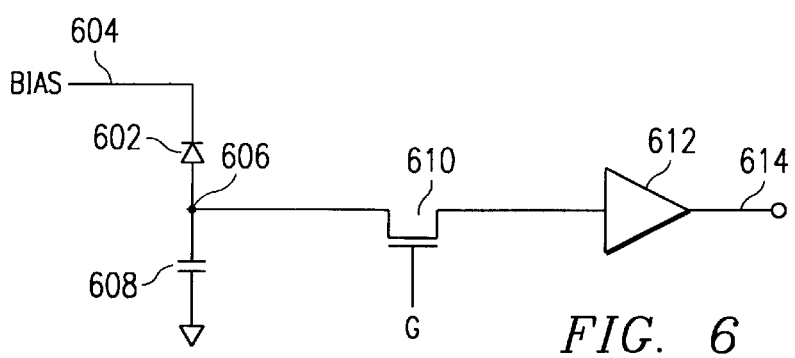
FIG. 6 illustrates a schematic diagram of a single pixel.

Referring now to FIG. 6, there is illustrated a schematic diagram of the pixel 302 as incorporated into a detection element. The pixel 302 basically comprises a Schottky diode 602 which has the cathode thereof connected to a bias voltage on a node 604 and the anode thereof connected to a node 606. In one embodiment, node 606 is connected to one plate of a storage capacitor 608, the other plate thereof connected to ground. The Schottky diode 602 is operable to collect electrons for storage on the upper plate of the capacitor 608. This storage of electrons results in an increase in the voltage across the plates of the capacitor 608 which can later be transferred through a gate transistor 610 to the input of a charge amplifier 612 for output on an output node 614.

The structure and operation of the Schottky diode 602 is described in K. Aflatooni, A. Nathan, R. I. Hornsey, I. A. Cunningham, "A Novel Detection Scheme for Large Area Imaging of Low Energy X-Rays Using Amorphous Silicon Technology," Technical Digest, 9th Int. Conf. On Solid-State Sensors and Actuators, June 16–19, Chicago, 1997, pp. 1299–1302, which is incorporated herein by reference. In general, the Schottky diode is comprised of various layers, one being an anode contact and one being a cathode contact with the layer of a-Si:H material disposed therebetween. The contact thereof has a layer of heavily doped a-Si:H material disposed therein to establish ohmic contact. The top contact, the anode, is formed by the deposition of the heavy metal such as Mo. When the diode is reversed biased, i.e., there is a positive voltage disposed on the anode, this will result in a relatively low reverse bias current, which is a function of the area. Additionally, the reverse current can be affected by the reverse bias voltage, which may result in a time-dependent variation in the reverse current.

In general, it has been reported in the literature that X-ray sensitivity measurements for a 200 $\mu m^2$ Schottky diode with a reverse bias of 2 volts, exhibits a collection of electron vs. the X-ray source voltage level kVp will span the range 20 kcV to 100 kcV. At a source voltage of 50 kVp, the measured electrons over a period of 500 ms is approximately $4 \times 10^7$. At higher energies on the order of 100 kVp, the measured electrons were approximately $2 \times 10^8$. In general, the thickness of the a-Si:H layer will affect a collection efficiency of electrons in the Schottky diode. Once the intrinsic layer of thickness exceeds the maximum range of the electrons ($\approx 1$ $\mu$m), the output signal will in general, saturate or decrease. This is due to the fact that the depletion layer no longer widens resulting in an increased width of the neutral region. This increased width leads to a degradation in the number of collected electrons, particularly when the width of the neutral region exceeds the electron depletion layer.

Referring further to FIG. 6, the electrons are allowed to be collected over a period of approximately 500 ms (it being understood that this number can vary, depending upon the geometry and the processing technology) and then gated out from the node 606 at a predetermined time. The amplifier 612 is a high impedance amplifier that will not cause a significant discharge of the capacitor 608. Therefore, an exposure would typically be effected by turning on the X-ray source 104 for a period of 500 ms and then sampling all of the capacitors 608 in the detector array in a predetermined order.

Figure 7:
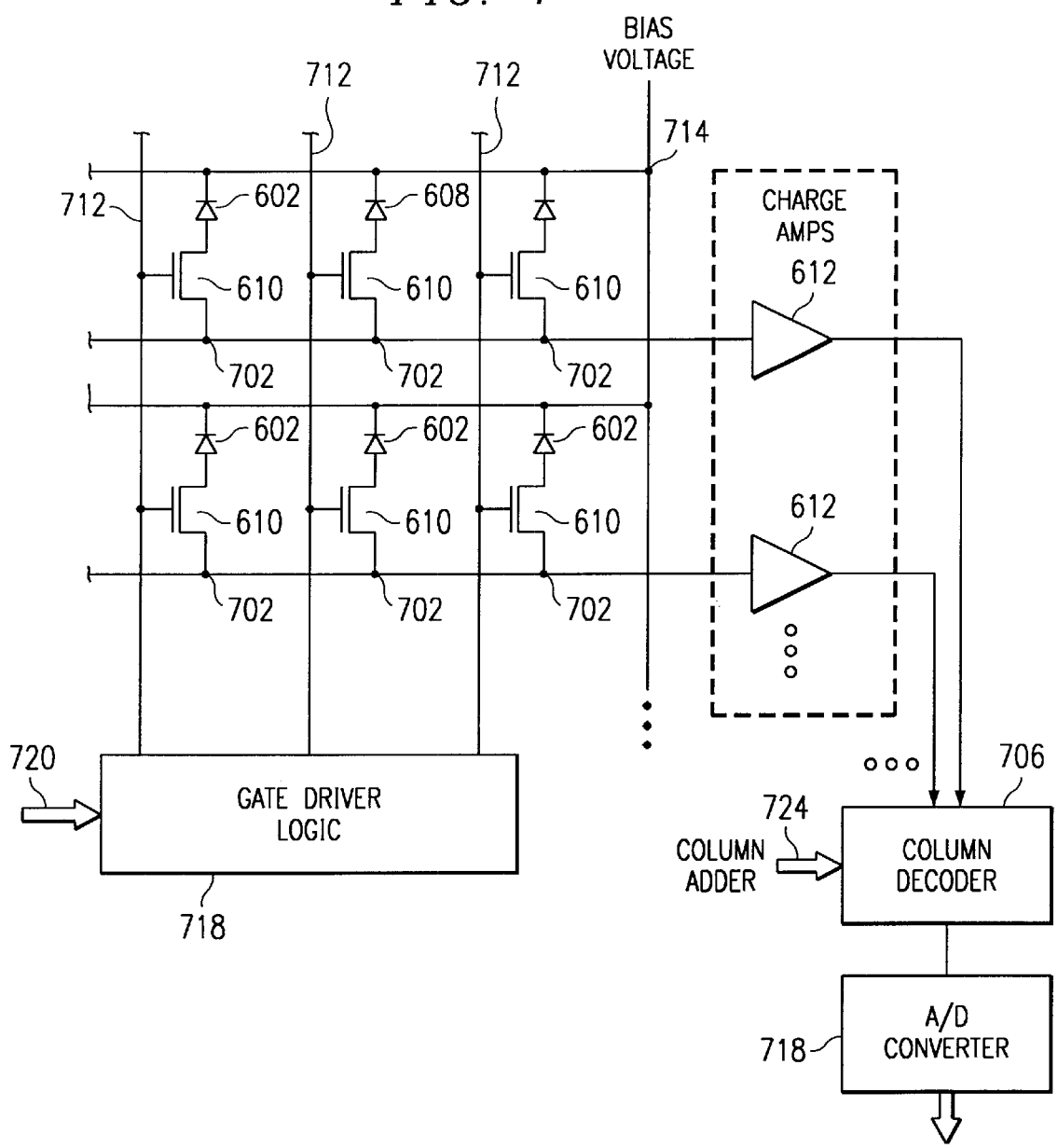
FIG. 7 illustrates a schematic diagram of a portion of an array of pixels.

Referring now to FIG. 7, there is illustrated a diagrammatic view of the array configuration of the pixel elements 302. This is a schematic representation and does not actually represent the physical layout of the array. In fact, it is the detector elements 202–208 in the form of the Spherical ICs that are actually arranged in an array of rows and columns. The actual pixels 302 are not necessarily arranged in rows and columns, although an ordered system in the disclosed embodiment does place them in an order of rows and columns.

In the schematic representation of the array, all of the pixel elements 302 will be arranged in an array from an electronic standpoint such that they can all have a specific address in the form of rows and columns. In this manner, each transistor 610 would be arranged such that the source/drain path thereof was connected on one side thereof to the cathode of the Schottky diode 602 and on the other side thereof to a data node 702. All of the transistors in a given row would have the other side of the source/drain path of the associated transistor 610 connected to data node 702. The data node 702 would then be transferred to the charge amplifier 612 one at a time. Although not illustrated,-there is also provided one of the capacitors 608 for storage of a charge therein at the junction between the source/drain path of the transistor 610 and the cathode of the Schottky diode 602. Therefore, whenever the gate of the transistor 610 is activated, it will transfer the voltage stored on the upper plate of the capacitor 608 (not shown in FIG. 7) to the data node 702 in that particular row. Each of the outputs of the charge amplifier 612 for each of the rows, there being only one for each of the rows, would then be input to a column decoder 706, the output thereof input to an AID converter 708. The A/b converter 708 will convert the analog output of each of the charge amplifiers 612 to a digital value for storage thereof or for subsequent processing and display.

Each of the gates of each of the transistors 612 is connected to a corresponding Word line 712. Each of the cathodes of each of the diodes 608 would be connected to a bias voltage node 714 to apply reverse bias thereto. The Word lines 712 are each connected to the output of a gate driver logic block 718, which receives a row address on a bus 720. Basically, there is provided in the gate driver logic block 718 an address decoder which decodes the digital address on the bus 720 and then drives the voltage on a selected one of the Word lines 712, it being understood that only one Word line 712 can be driven at a time. However, a column address on a bus 724 input to the column decoder 706 can actually select multiple outputs from the charge amplifiers 612, this then requiring a separate A/D converter. 708 for each column decode output. This is merely a function of the amount of processing that can be incorporated into the subsequent processing circuitry.

Figure 7A:
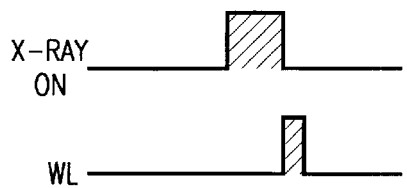
FIG. 7a illustrates a timing diagram for access of detector pixels.

In operation, as illustrated in FIG. 7a, the first operation that is required is that the X-ray source be turned on for a predetermined period of time, approximately 500 ms. The X-rays will impinge upon the particular detector elements 302 and the associated Schottky diode 602 such that electrons are accelerated through the depletion layer of the Schottky diode 602 and collected on the lower contact plate thereof, i.e., the cathode. This will then be collected on the upper plate of the capacitor 606. At the end of the on pulse, the X-ray machine is turned off and then the Word lines 712 are sequentially activated. This will occur for all of the Word lines 712 until all of the data is collected.

Although illustrated as an array of rows and columns, it should be understood that the rows and columns for the entire system could be provided by two arrays, an upper array and a lower array, one for the upper spherical semiconductors and one for the lower spherical semiconductors in the bottom layer. It is only important that some scheme be derived that can access each of the pixels 302 separately.

Figure 8:
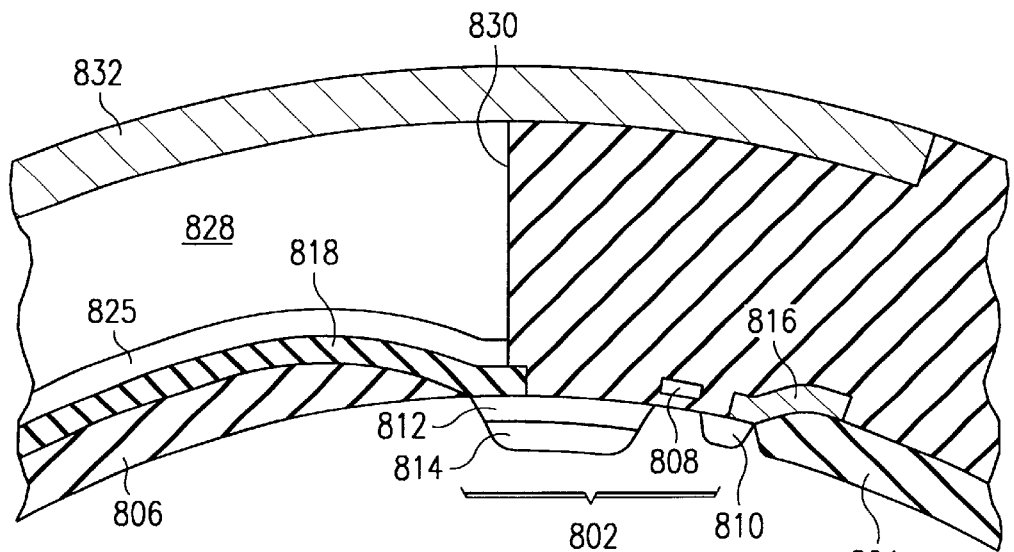
FIG. 8 illustrates a detailed cross-sectional view of the detector pixel and the associated transistor for the pixel.

Referring now to FIG. 8, there is illustrated a cross-sectional diagram of the transistor 610 and the Schottky diode 602. During processing, the first step of processing is to form the transistor. The transistor is a standard MOS transistor that would be found in a standard gate or even in a memory cell. In the first step, an active region 802 is defined which has field oxide regions or isolation regions of insulating material 804 and 806 defined on either side thereof. Thereafter, a layer of gate oxide (not shown) will be formed over the substrate and then a gate electrode 808 patterned and formed thereon. Once the gate electrode 808 is defined, the source/drain regions are then defined with a self-aligned process wherein the gate electrode 808 defines the edge of the channel regions. This will result in a source/drain region 810 formed on one side of the gate electrode 808 and a source/drain region 812 formed on the other side of the gate electrode 808. In the configuration illustrated in the disclosed embodiment of FIG. 8, the source/drain region 812 is considerably larger than the source/drain region 810. The reason for this is that this will define the upper plate of the capacitor 606. The lower plate of the capacitor is formed with the substrate and the capacitor defined by a depletion region. Therefore, during processing, a depletion implant 814 is formed beneath the source/drain region 812. However, this depletion implant may not be there as the capacitor plate can be formed by an inversion layer. This is a conventional structure for a dynamic random access memory (DRAM) cell. The size of the capacitor is a function of the size of the source/drain region 812.

After formation of the source/drain regions 812 and 810, a layer of oxide is disposed over the substrate (not shown)

to a predetermined thickness. This is then patterned and etched to define a via at the source/drain regions and then a layer of conformal polycrystalline silicon is disposed over the substrate and patterned to form a conductive contact 816 with the source/drain region 810 and the remaining conductive lines in the circuit. Typically, prior to forming the conformal layer of polycrystalline silicon, there will be an n+ implant made into the source/drain region 812 at the point which polycrystalline silicon will contact that area to improve the element contact thereof. The lower plate of the diode is formed from copper by depositing a layer of copper onto the substrate and then patterning and etching this layer to form a conductive contact 818 with the source/drain region 812. A layer of amorphous silicon is then deposited on the substrate which has a high n+ content. This forms an ohmic contact with the conductor 818, the lower contact of the diode. Thereafter, a layer of a-Si:H is deposited on the substrate with a sputtering technique which is done at relatively low temperatures with high uniformity. Once deposited, using standard plasma-enhanced chemical vapor deposition (PECVD) processes, these layers are then patterned to define a border 830 that defines the edge of the pixel 302. Thereafter, a layer of insulating material is disposed over the substrate to fill the spaces between the pixel elements 302 between borders 830 and then etched with a planar etch to expose the upper surface of the silicon layer 828. Thereafter, a layer of heavy metal in the form of molybdenum (Mo) is deposited with a sputter deposition technique onto the upper surface of the partially fabricated substrate. Typically, the layer 828 will have a thickness of approximately 5 microns with the layer of molybdenum 832 having a thickness of approximately 1 micron. Once the metal layer 832 is deposited, it is then patterned and etched to define the upper contact region.

Figure 9:
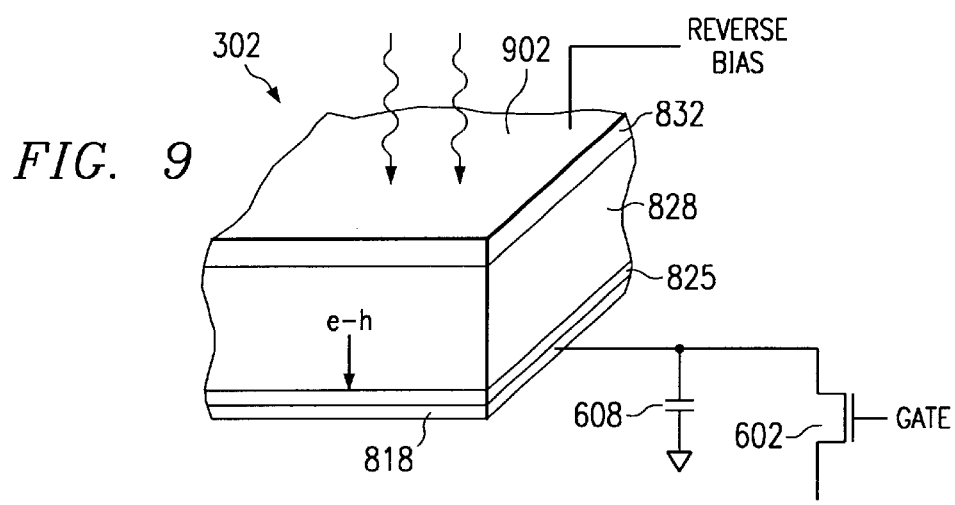
FIG. 9 illustrates a diagrammatic view of a single pixel in three dimensions.
Figure 9A:
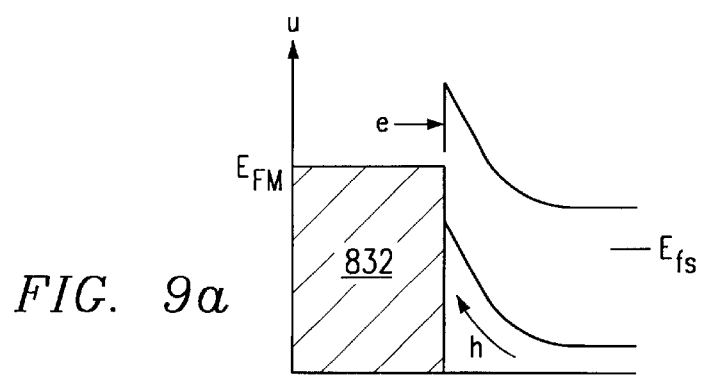
FIG. 9a illustrates a diagrammatic view of the energy levels at the interface for the Schottky diode.

Referring now to FIG. 9, there is illustrated a three-dimensional view of a pixel element 302. This illustrates the overall structure where X-rays impinging upon an upper surface 902 of the metal layer 832 will create electron hole pairs that are driven down to the metal lower contact 818. It can be seen in the diagram of FIG. 9a, that the holes move toward the metal whereas the electrons move away from the metal. This trapping of holes at the interface results in an increasing reverse current. The y-axis represents the energy whereas the x-axis represents the distance. The Fermi levels in the metal are illustrated by the $E_{fm}$ value and the Fermi level in the amorphous hydrogenated silicon is illustrated by the term $E_{fs}$.

Figure 10:
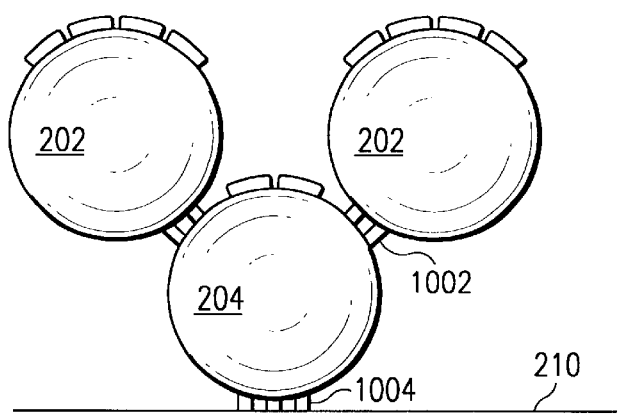
FIG. 10 illustrates a diagrammatic view of the clustering of the two layers of pixels.
Figure 11:
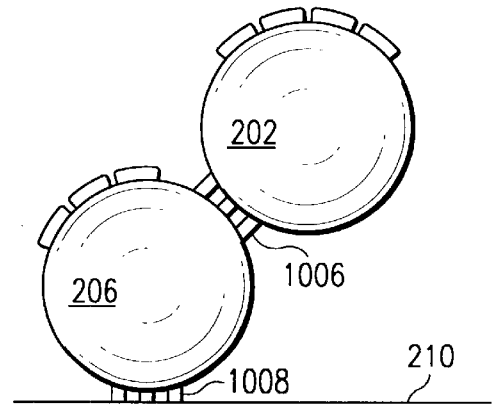
FIG. 11 illustrates another view of the clustering of two pixels illustrating an edge or corner spherical semiconductor.

Referring now to FIG. 10, there is illustrated a cross-sectional diagram of the method by which the Spherical ICs are "clustered" in order to allow interconnection thereof. In general, an interconnect pattern of conductors is defined on the surface from the transistor 602 to other locations thereon. Contacts are formed thereat and subsequent contacts formed such as solder bumps. This procedure is described in U.S. Pat. No. 5,877,943, issued to the present assignee and which patent is incorporated herein by reference. In general, once the contacts are formed and the bumps are formed, it is necessary to assemble them in a manner such that they contact each other for pass through. For example, in the upper layer with the top Spherical ICs 202, it is necessary to make a connection between the center Spherical IC 202 and the substrate 210. This is done via the center Spherical IC 204 to the substrate 210. There is provided on the top Spherical 202 a plurality of solder bumps 1002 which contact with surfaces or pads on the center Spherical IC 204. Similarly, there are provided on the lower surface of the center Spherical IC 204 a plurality of solder bumps 1004 which connect with pads on the substrate 210. With respect to FIG. 11, it can be seen how one of the top Spherical ICs 202 is connected with either the edge of Spherical ICs 206 or the comer Spherical IC 208, only the edge Spherical IC 206 illustrated. Again, there are a plurality of solder bumps 1006 disposed on the surface of the top Spherical IC 202 which connect to pads on the surface of the edge Spherical IC 206 for connection therethrough to the lower surface thereof. On the lower surface thereof there are a plurality of contacts which have solder bumps 1008 associated therewith for connection to an interface to the substrate 210.

Figure 12:
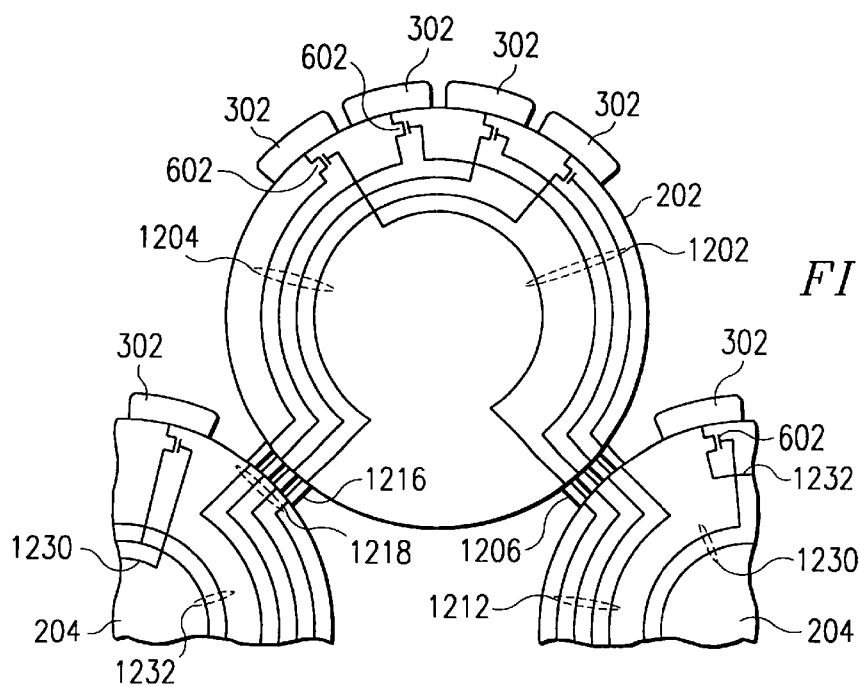
FIG. 12 illustrates a diagrammatic view of the interconnection diagram for the multiple spherical semiconductor detectors showing the various interconnection schemes.

Referring now to FIG. 12, there is illustrated a more detailed diagram for the interconnection of the various transistors. As described hereinabove, the transistors 602 were formed on the upper surface to allow gating of the charge therefrom. This is facilitated by providing interconnection lines between the side of the source/drain path of each of the transistors 602 diametrically opposite the capacitor 608 (not shown) and a plurality of interconnect lines. In the illustration of FIG. 12, the top Spherical IC 202 has four pixel elements illustrated in cross section, this being the center row thereof. Each of these has a transistor 602 associated therewith, which transistor 602 has the gate thereof connected to one of a plurality of interconnect lines 1202 and the opposite side of the source/drain path thereof connected to four lines 1204. The lines 1202 are illustrated as extending to a plurality of solder bumps 1206 on one side which connect with a center Spherical IC 204. There will be a plurality of gate connect pass through lines 1212 that will be passed therethrough to the lower surface thereof for interfacing to the substrate 210. The source/drain connect lines 1204 on the other end, can go to the opposite side of the Spherical IC 202 and interconnect with the center Spherical IC 204 on the opposite side of the corresponding solder bumps 1216. This would be a plurality of solder bumps 1216. This would interface with a plurality of source/drain connect lines 1218 which would be passed through to the substrate 210. Similarly, in each of the center Spherical ICs 204, the gates of the transistor 602 are connected to the substrate via gate lines 1230, there only being two gates in the particular row illustrated and the source/drain paths will be routed to the opposite side via source/drain lines 1232.

It should be noted in the embodiment of FIG. 12 that all the gate lines are routed separately. This allows for different transistors 602 to be disposed in different portions of the array. However, the preferred implementation would be that all transistors in a given row would share a common data line with the gates separately routed, to reduce the number of connections. Additionally, although not shown, there would be a common reverse bias line to the upper plate of the pixels 302 which would be passed through at least one of the sets of solder bumps 1216 or 1206. The other side, of course, would be some type of ground connection.

Figure 13:
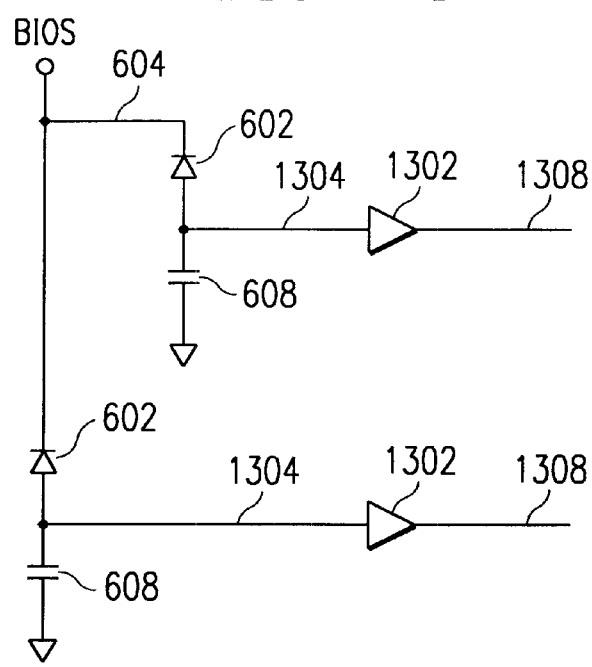
FIG. 13 illustrates a schematic diagram for an alternate scheme to extract a charge from the Schottky diode detector.

Referring now to FIG. 13, there is illustrated an alternative interconnection scheme for sampling the charge stored on capacitor 608. Each of the capacitors 608 has the upper plate thereof connected to the input of an amplifier 1302 via an interconnect line 1304. This is an analog amplifier which can be a differential amplifier input or could be as simple as a source follower. However, a source follower amplifier has a disadvantage in that the voltage will drop by a threshold voltage of the transistor, such that a source coupled pair of transistors would provide less of a level shift. In any event, the output of amplifier 1302 on a line 1308 is an analog voltage. The analog voltage would be an amplified analog voltage that would be routed all the way to the output. Such an arrangement would require there to be a separate data output for each pixel. This could, of course, be input to a sample and hold structure that could then be multiplexed for outputs therefrom. The purpose for this is to provide some gain to the voltage stored on the capacitor 608 and also store this on a larger capacitor which would retain the voltage level for a longer period of time. This capacitor and structure is not shown.

Figure 14:
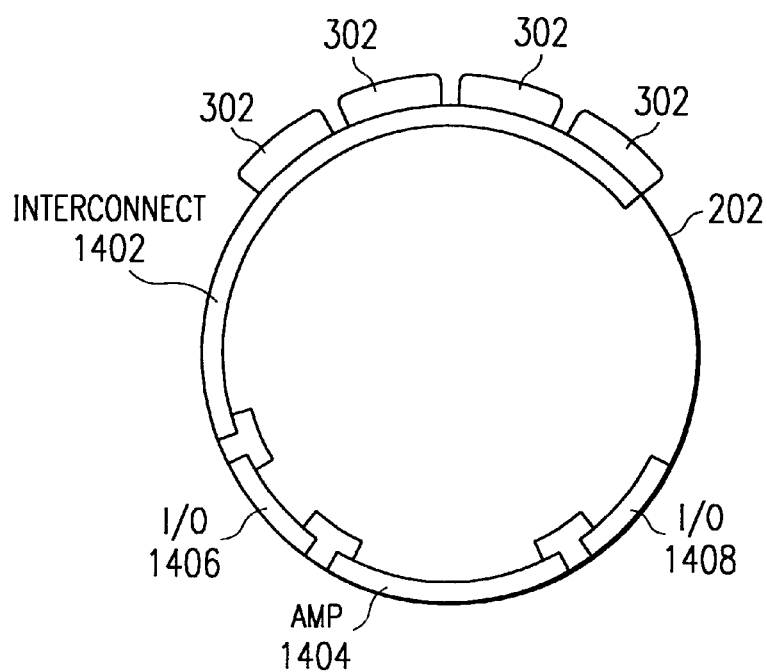
FIG. 14 illustrates a cross-sectional view of the interconnect diagram for a single spherical semi-conductor.

Referring now to FIG. 14, there is illustrated a cross-sectional view showing the layout of the various structures. Each of the pixels 302 in the center Spherical IC 202, for example, are illustrated as having an interconnect set of lines passed around the outer surface of the Spherical IC 202 through an area 1402. On the lower surface thereof, there is provided an amplification area 1404 which is reserved for the amplifiers 1302. These amplifiers in regions 1404 then interconnect with Input/Output (I/O) regions 1406 on the lower surface of the Spherical IC 202, this being the location of the solder bumps and the interconnection to the other Spherical ICs. It is noted that, once the amplifiers 1302 are disposed in the region 1404, this will actually isolate these amplifiers 1302 from the upper surface thereof and the impinging X-rays. This does provide more isolation than if the transistors are disposed merely under the upper Mo layer.

Figure 15:
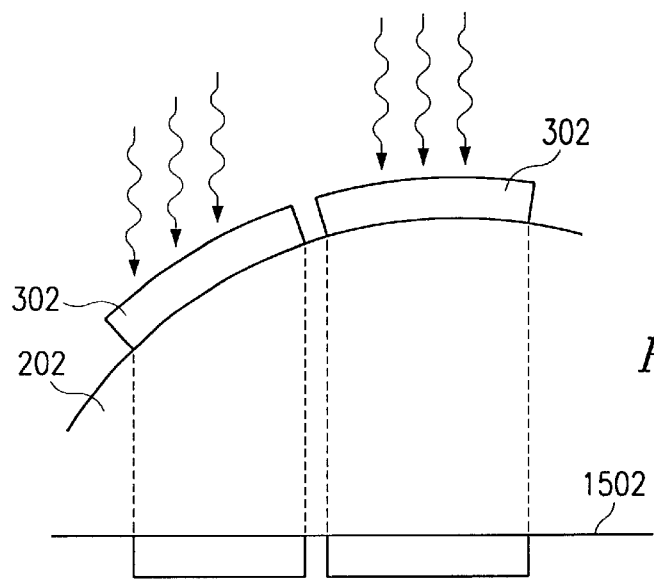
FIG. 15 illustrates a cross-sectional view of a portion of a spherical semiconductor detector.

Referring now to FIG. 15, there is illustrated a cross-sectional view of the center Spherical IC 202 with the pixel 302 disposed on the upper surface thereof, illustrating the impinging X-rays thereon. The pixels 302, as noted hereinabove, are disposed on a spherical surface. Therefore, when they are projected down into the actual plane of impingement, they possibly will have a different surface area on that plane. This could result in aberrations in the output of each of the pixels 302, as the output is a function of the amount of energy that will be impinged on the surface area. This situation will be exacerbated with respect to the lower layer Spherical ICs, such as the center Spherical IC 204. If any portion of the exposed surface of the pixel 302 is shadowed by a top Spherical IC 202, this could reduce the amount of energy associated therewith. As such, some type of calibration must be incorporated. Further, when the upper surface of the pixel 302 is disposed on an angle with respect to the plane of incidence, this will result in a smaller spacing between the pixels 302 on the plane of incidence when projected thereon. This will effectively move them closer together, thus allowing more potential coverage of the surface. The process for the disclosed embodiment has a limitation on the line spacing of 2–4 microns. By disposing the pixels 302 on an angle, the effective line spacing can be reduced.

Figure 16:
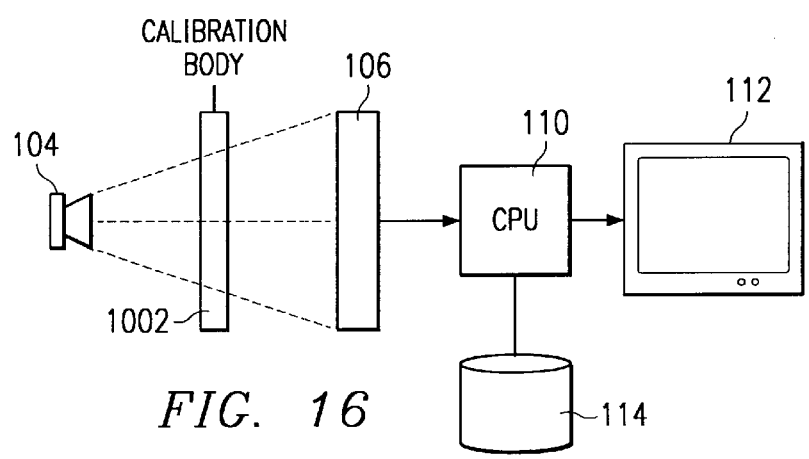
FIG. 16 illustrates a calibration procedure for calibrating out surface anomalies.
Figure 17:
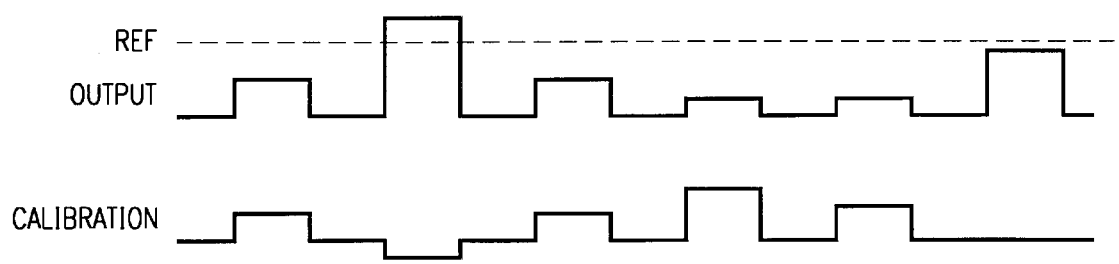
FIG. 17 illustrates a calibration offset.

Referring now to FIG. 16, there is illustrated a diagrammatic view of the calibration operation. The body 102 is replaced by calibration body 1602. The calibration body 1602 is a body of uniform density such that it will absorb X-rays equal to that of an average absorption at an irradiated object. This will then provide a uniform reference level to the detector array 106. If the outputs were all uniform and all the detector arrays were in a common plane, one would expect the output of each detector element to be identical. However, due to the irregular surface and also due to fabrication variations in manufacturing and processing, one would expect the output to vary. With the calibration body 1602, an exemplary output can be derived. This is illustrated in FIG. 17 and labeled "Output." A reference level is defined and, the difference between the reference level and the actual output for each pixel is determined. This is stored as a calibration level. This is illustrated in the "CAL" curve, wherein there are positive and negative values associated with each pixel. As such, when an image is then taken, this calibration number can be added thereto.

In summary, there has been provided a solid state flat panel detector array for X-rays, which is operable to detect X-rays passing through an irradiated object. The detector array is comprised of a plurality of detector elements which comprise Spherical ICs. Each Spherical IC has associated therewith a plurality of X-ray detection pixels, each pixel utilizing a Schottky diode configuration. The Schottky diode configuration is formed with a layer of hydrogenated amorphous silicon (a-Si:H) with a heavy metal layer of molybdenum (Mo) disposed on the upper surface thereof and a layer of metal as a lower contact on the lower surface thereof. The upper Mo layer, the cathode, is then connected to a reverse bias voltage such that a radiation thereof by X-rays will cause an electron-hole transfer to the lower contact and a subsequent reverse current. This is stored on a capacitor which is sampled at a later time.

Although the preferred embodiment has been described in detail, it should be understood that various changes, substitutions and alterations can be made therein without departing from the spirit and scope of the invention as defined by the appended claims.

What is claimed is:

1. An x-ray detector, comprising:
   a plurality of detector elements, each having a defined surface area and for detecting energy from impinging x-rays on said defined surface area to provide an output signal therefrom with a level corresponding to the energy of the impinging x-rays;
   a plurality of supporting substrates, each having a spherical surface, and each spherical surface supporting at least one of said detector elements;
   a first set of supporting substrates of said plurality are formed in a first layer and arranged so as to define spaces between adjacent supporting substrates in the first layer;
   a second set of supporting substrates of said plurality are formed in a second layer and arranged so as to be nested in the spaces between the supporting substrates of said first layer;
   the detector elements of the supporting substrates of said first and second sets being oriented so as to receive the impinging x-rays;
   a base for supporting at least one set of said supporting substrates; and
   a processing system for processing the output of each of said detector elements to define an image.

2. The detector of claim 1, wherein select ones of said supporting substrates are operable to contain a plurality of said detector elements.

3. The detector of claim 2, wherein said plurality of detector elements on said select ones of said supporting substrates are arranged in n array on the respective spherical surfaces thereof.

4. The detector of claim 1, wherein said base is operable to support a set of said support substrates in an array.

5. The detector of claim 4, wherein select ones of said supporting substrates have a plurality of detector elements associated therewith and said detector elements associated therewith are arranged in an array.

6. The detector of claim 1, wherein said processing system is comprised of a main processor and a preprocessor, said preprocessor performing a portion of the processing of the output of each of said detector elements and said preprocessor being disposed on said supporting substrate.

7. The detector of claim 1, wherein each of said supporting substrates comprises a semiconductor sphere with at least one detector element disposed on an upper surface thereof.

8. The detector of claim 7, wherein said detector element is an integrated circuit element which is fabricated on said semiconductor sphere.

9. The detector of claim 8, wherein said detector element comprises a Schottky diode that is reverse biased and generates a reverse current in the presence of energy from impinging x-rays, and said current is sensed by said processing system.

10. The detector of claim 9, wherein said Schottky diode comprises:

a layer of hydrogenated amorphous silicon (a-Si:H) disposed on a lower conductive contact layer; and an upper heavy metal layer forming the cathode of said Schottky diode and said lower contact layer forming the anode thereof.

11. The detector of claim 10, wherein said upper heavy metal layer is molybdenum.

12. The detector of claim 7, further including interconnect lines disposed on said semiconductor sphere from the upper surface thereof to the lower surface thereof, said interconnect lines for interconnecting said detector element to the lower surface thereof, and further comprising an interface between said semiconductor sphere and said base for interfacing with said processing system.

13. The detector of claim 1, wherein said supporting substrates each include interconnect lines, and wherein said supporting substrates in said first layer have respective interconnect lines connecting from each said detector element on the spherical surface thereof to an input/output interface for interfacing with a corresponding first input/output interface on the spherical surface of an adjacent and touching one of said supporting substrates in said second layer, and wherein said supporting substrates in said second layer have interconnect lines between said detector elements associated therewith and a second input/output interface on the lower surface thereof, and interconnect lines between said input/output interface and said second input/output interface with said second input/output interface being connected to said base wherein said base has interconnect lines associated therewith for interfacing with said processing system.

14. The detector of claim 1, wherein the number of detector elements of the supporting substrates are formed thereon as a function of location of the respective supporting substrates.

15. The detector of claim 14, wherein said detector elements of each layer are formed as respective arrays, the supporting substrates of said first layer each having the same number of detector elements formed on the respective spherical surfaces thereof, and ones of the supporting substrates of said second layer having a different number of detector elements formed on the respective spherical surfaces thereof.

16. The detector of claim 15, wherein the supporting substrates of said second layer include corner, edge and center groups of supporting substrates, and the number of detector elements in each said group of supporting substrates is different.

* * * * *